United States Patent
Hembree

(12) 
(10) Patent No.: US 6,574,858 B1
(45) Date of Patent: *Jun. 10, 2003

(54) METHOD OF MANUFACTURING A CHIP PACKAGE

(75) Inventor: David R. Hembree, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/023,674

(22) Filed: Feb. 13, 1998

(51) Int. Cl.$^7$ .............................................. H01R 43/00
(52) U.S. Cl. ........................... 29/827; 29/832; 29/825; 29/413; 257/684; 257/668
(58) Field of Search .................. 29/827, 832, 413, 29/743, 825, 740; 257/668, 707, 664; 198/692, 693

(56) References Cited

U.S. PATENT DOCUMENTS

| | | | |
|---|---|---|---|
| 3,387,365 A | | 6/1968 | Stelmak .................... 29/840 |
| 3,961,413 A | | 6/1976 | Noe .......................... 29/569 |
| 3,982,317 A | | 9/1976 | Eysermans ................ 29/588 |
| 4,100,675 A | | 7/1978 | Landsittel ................. 29/627 |
| 4,219,926 A | | 9/1980 | Bloch et al. .............. 29/832 |
| 4,252,864 A | | 2/1981 | Coldren ................ 174/52.4 X |
| 4,316,320 A | | 2/1982 | Nogawa et al. ........... 29/832 |
| 4,343,083 A | | 8/1982 | Takemura et al. ........ 29/832 |
| 4,480,150 A | * | 10/1984 | Jones et al. ............ 174/52 FP |
| 4,567,643 A | * | 2/1986 | Droguet et al. ........... 29/575 |
| 4,663,650 A | | 5/1987 | Gilder, Jr. et al. ..... 174/52.4 X |
| 4,667,403 A | | 5/1987 | Edinger et al. ........... 29/840 |
| 5,023,202 A | * | 6/1991 | Long et al. ............. 437/206 |
| 5,066,614 A | * | 11/1991 | Dunnaway et al. ...... 437/209 |
| 5,352,633 A | * | 10/1994 | Abbott ................... 437/211 |
| 5,357,674 A | * | 10/1994 | Lumbard ................. 29/843 |
| 5,366,933 A | * | 11/1994 | Golwalker et al. ....... 437/215 |
| 5,535,509 A | * | 7/1996 | Tomita et al. ........... 29/827 |
| 5,620,927 A | * | 4/1997 | Lee ......................... 29/841 |
| 5,637,916 A | | 6/1997 | Joshi ...................... 257/668 |
| 5,765,277 A | * | 6/1998 | Jin et al. ................. 29/743 |

(List continued on next page.)

OTHER PUBLICATIONS

Kyocera Mulilayer Ceramics Design Guidelines.
"Toshiba Offers Greater ASIC Flexibility With New Packaging" Two–Ten Communications Limited 1997.
IBM Tech Disc Bull vol. 24, No. 2, Jul. 1981, p. 1214, by Auletta et al.

Primary Examiner—Carl J. Arbes
Assistant Examiner—Minh Trinh
(74) Attorney, Agent, or Firm—Workman, Nydegger & Seeley

(57) ABSTRACT

The present invention is a chip scale package handling part and process manufacturing method that uses existing automated equipment to economically mass produce chip scale packages. The present invention includes a unitary substrate panel having a plurality of die attach areas thereon for forming chip scale packages. The substrate panel has indexing holes formed therein so that the substrate panel is capable of being indexed by lead frame handling equipment. The lead frame handling equipment indexes the substrate panel through chip scale package fabrication machinery, where the chip scale package fabrication machinery is compatible for indexing lead frames therethrough. Examples of the chip scale package fabrication machinery include die attach machinery and wire-bonders. Conductive contacts are attached to the bottom portion of the substrate panel and the substrate panel is singulated to form a plurality of separated chip scale packages. The chip scale packages are preferably encapsulated for protection.

34 Claims, 4 Drawing Sheets

U.S. PATENT DOCUMENTS

| | | |
|---|---|---|
| 5,802,709 A | 9/1998 | Hogge et al. ........... 174/52.4 X |
| 5,852,870 A * | 12/1998 | Freyman et al. ............... 29/841 |
| 5,854,741 A * | 12/1998 | Shim et al. .................. 361/813 |
| 5,897,334 A | 4/1999 | Ha et al. ..................... 438/107 |
| 5,951,804 A * | 9/1999 | Kweon et al. .......... 156/244.12 |
| 5,953,216 A * | 9/1999 | Farnworth et al. ........... 361/777 |
| 5,960,961 A | 10/1999 | Gutentag .................... 206/714 |
| 5,987,722 A * | 11/1999 | Park et al. ................ 29/25.014 |
| 5,990,545 A | 11/1999 | Schueller et al. ............ 257/697 |
| 6,001,671 A * | 12/1999 | Fjelstad ....................... 438/112 |
| 6,013,946 A | 1/2000 | Lee et al. ............... 257/697 X |
| 6,049,972 A * | 4/2000 | Link et al. ..................... 29/827 |
| 6,408,510 B1 * | 6/2002 | Hembree ...................... 29/841 |
| 2002/0175153 A1 * | 11/2002 | Hembree .................... 219/209 |

* cited by examiner (Related Technology)

METHOD OF MANUFACTURING A CHIP PACKAGE

BACKGROUND OF THE INVENTION

1. The Field of the Invention

The present invention is directed to chip scale package manufacturing. More specifically, the present invention is directed to methods and apparatuses used to transport multiple chips on a unitary substrate through chip scale package manufacturing equipment using lead frame handling equipment that contacts indexing holes on the substrate so as to index the substrate through the chip scale package manufacturing equipment.

2. The Relevant Technology

Chip scale packages or chip size packages are microchip packaging arrangements that are slightly larger than the microchip itself, on the order to 1.2 to about 1.3 times the size of the chip or smaller. A chip scale package may also be the same size as the die itself. As illustrated in FIG. 1, a chip scale package 10 includes a rigid substrate 14 having therethrough a plurality of electrically conductive vias 22, seen in phantom that electrically connect to solder balls 16 on a bottom surface 17 of substrate 14. A chip or die 12, such as a memory chip, is located on a top surface 15 of substrate 14 and is wire-bonded by wire bonds 20 to bond pads 18 which are electrically connected to solder balls 16 through vias 22. As such, die 12 is electrically connected to solder balls 16 through vias 22. Once the appropriate interconnections are in place, an encapsulant 82, seen in phantom, is used to encapsulate die 12 and connections thereto to protect the same.

Existing automated equipment used in chip packaging, such as die attach and wire-bonders, are designed to accommodate lead frames. Lead frame compatible equipment, however, is not capable of accommodating chip scale package fabrication. As a result, chip scale package components are individually transported through chip scale package fabrication equipment in trays or boats where the components are held in place. Each tray or boat is usually in the form of a stamped metal tray or pocket. Typically, there is only one die and substrate therefor in a corresponding one tray or boat. As such, the assembly of chip scale packages in individual boats or trays is slow, tedious and expensive.

Alternatively, chip scale packaging equipment can be specifically designed to mass produce chip scale packages. Specifically designed chip scale packaging equipment is an efficient yet expensive way to produce chip scale packages. It would be a cost saving advantage to be able to fabricate chip scale packages without specifically designed chip scale packaging equipment by using existing equipment.

SUMMARY OF THE INVENTION

In accordance with the invention as embodied and broadly described herein, methods for manufacturing a chip scale package and a substrate panel for accommodating a plurality of chip scale packages are provided. The substrate panel in the present invention comprises a top portion opposite a bottom portion, a plurality of vias extending therethrough providing an electrical interconnection through the substrate panel, and a plurality of indexing holes for indexing the substrate panel through manufacturing equipment. The substrate panel further comprises a plurality of conductive landings and a plurality of die attach areas on the top portion of the substrate panel.

During chip scale packaging, the substrate panel is moved by lead frame handling equipment through chip scale packaging equipment. The lead frame handling equipment moves the substrate panel by contacting the indexing hole on the substrate panel. The chip scale packaging equipment through which the lead frame handling equipment moves the substrate panel includes die attach, wire bonding, encapsulation, die singulation, and other such chip packaging equipment.

The die attach equipment attaches a plurality of dies to the substrate panel and the wire bonding equipment connects wire bonds to bonding pads on the substrate panel that are associated with respective dies. Before or after encapsulation, the chip scale packages on the substrate panel are singulated to form a plurality of separated individual chip scale packages.

Conductive contacts, such as solder balls, which are attached to the bottom portion of the substrate panel, can be formed on the substrate panel by the chip scale packaging equipment through which the lead frame handling equipment moves the substrate panel. Alternatively, the conductive contacts can be pre-attached to the substrate panel prior to being indexed by the lead frame handling equipment through the chip scale packaging equipment.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is directed to methods and apparatuses for efficient chip scale package fabrication using a unitary substrate panel that is moved through the chip scale package fabrication process by lead frame handling equipment. The unitary substrate panel includes an array of die attach sites.

In the context of this document, the term substrate is defined to mean any supporting substrate including, but not limited to, any construction comprising semiconductive material, including bulk semiconductive material such as a semiconductive wafer, either alone or in assemblies comprising other materials thereon, and semiconductive material layers, either alone or in assemblies comprising other materials. In addition and more specifically, in the context of this document, the term substrate may also be defined to include FR-4 laminate printed circuit board materials and thick film substrates, such as a ceramic sheet having stencils or traces, ceramic packages and multichip modules.

Figure 1:
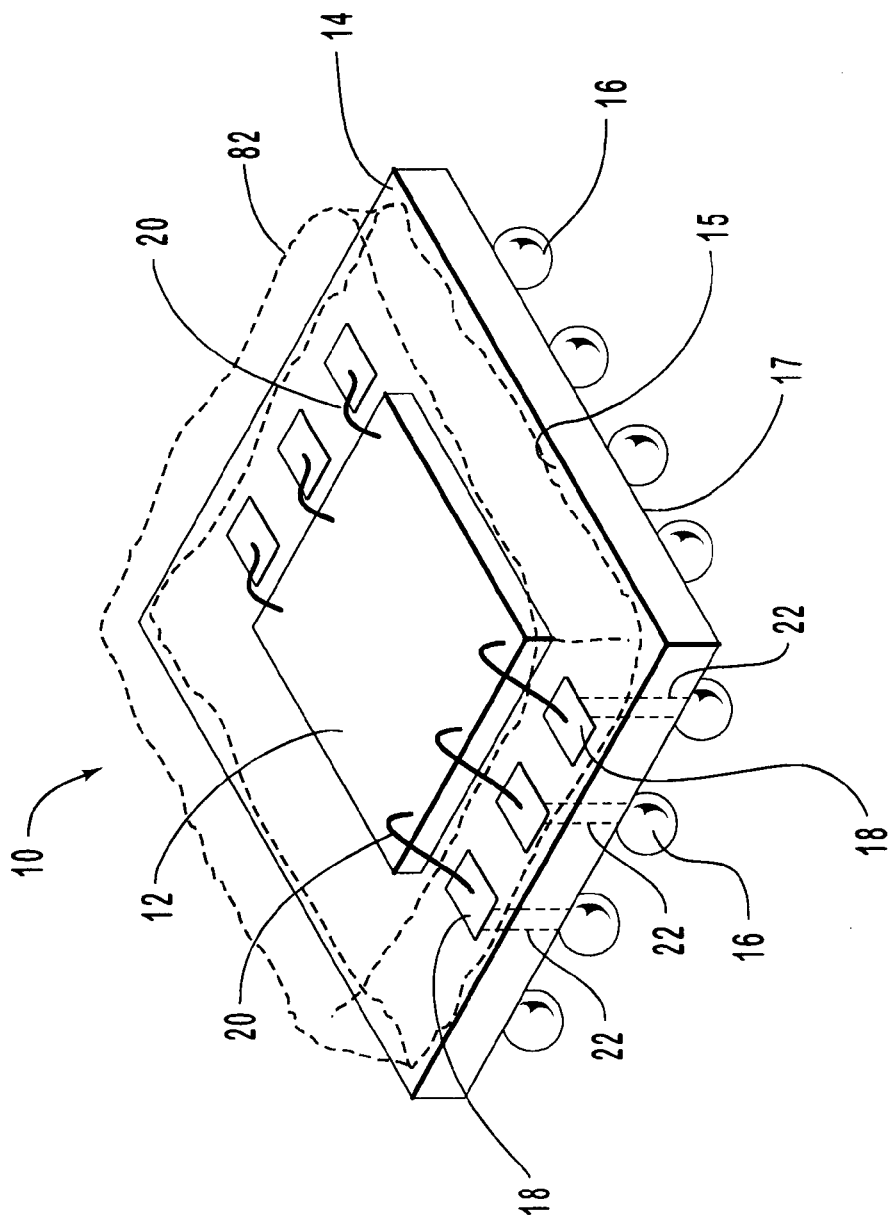
FIG. 1 is a perspective view of an individual chip scale package having an encapsulant thereover seen in phantom.
Figure 2:
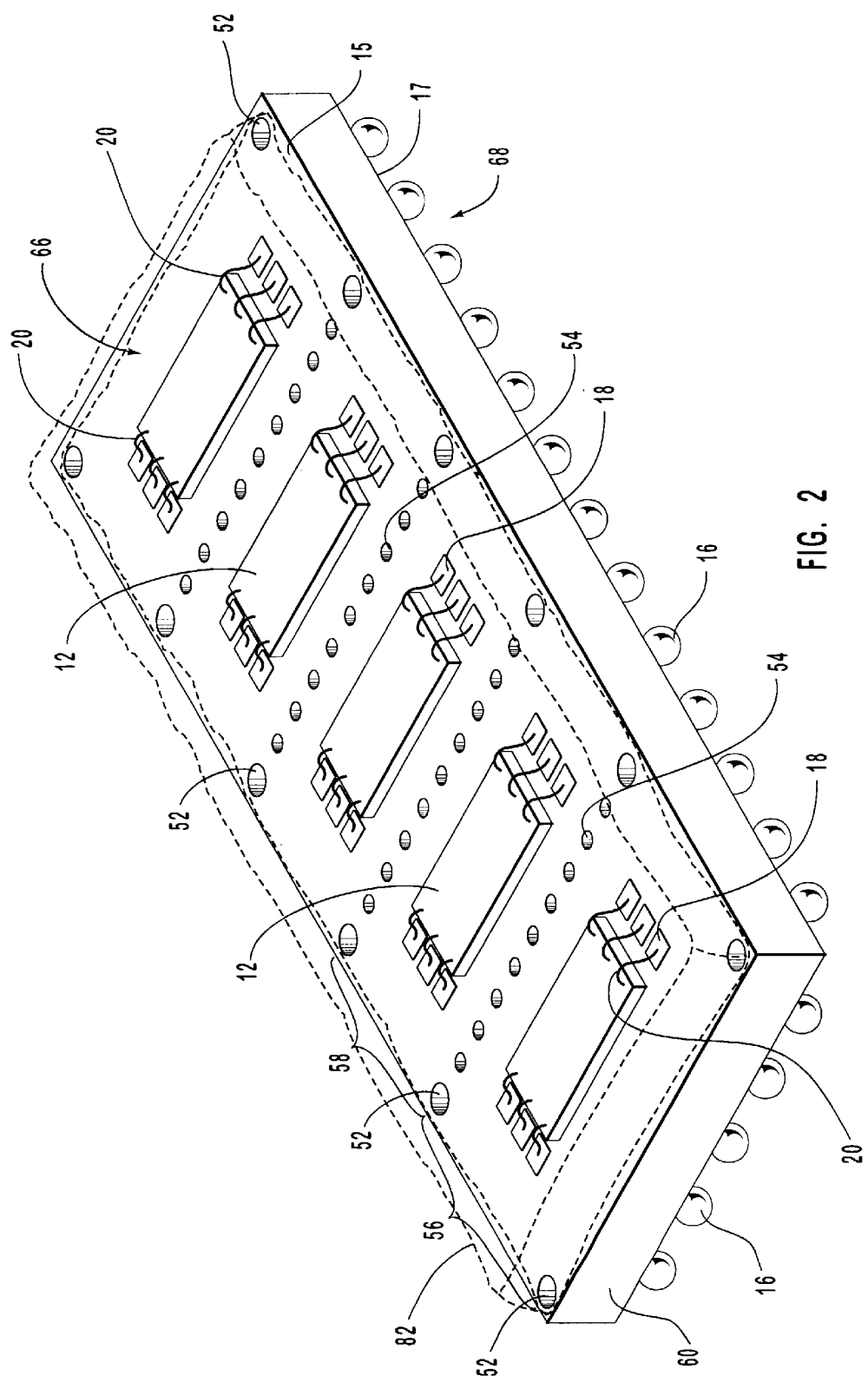
FIG. 2 is a perspective view of a substrate panel having there on a plurality of solder balls opposite a plurality of chips on die attach areas with an encapsulant thereover seen in phantom, the substrate panel having therethrough a plurality of indexing and cracker holes, each die being electrically connected to respective solder balls through wire bonds, wire bond pads, and electrically conductive vias extending through the substrate panel to the respective solder balls.

As illustrated in FIG. 2, the present invention comprises a substrate panel 60 having a top portion 66 opposite a bottom portion 68. Substrate panel 60 is used as a surface upon which a plurality of chip scale packages are to be fabricated. After the plurality of chip scale packages have been fabricated on substrate panel 60, each chip scale package is separated from the others by a singulation process performed upon substrate panel 60 to result in a chip scale package 10 illustrated in FIG. 1.

Substrate panel 60 in FIG. 2 shows five (5) dies 12, each mounted on a die attach area on substrate panel 60. Die 12 communicates through substrate panel 60 by electrically conductive landings 18. An electrical connection is made from die 12 by wire bonds 20 to wire bond pads 18 on substrate panel 60. Other conductive landings include, but are not limited to, flip chip applications with conductive adhesives, Z-axis conductive epoxies, and tape automated bonding (TAB) inter-connections.

Substrate panel 60 has a plurality of indexing holes 52 along the periphery thereof to allow substrate panel 60 to be moved. Indexing holes 52 around the periphery of substrate panel 60 are used by lead frame handling equipment to index substrate panel 60 through die attach equipment to place dies 12 upon die attach areas on substrate panel 60. Indexing holes 52 are also used by the lead frame handling equipment to index substrate panel 60 through wire bonding equipment so as to form wire bonds 20 to wire bond pads 18 on substrate panel 60. In an alternative embodiment, a conductive epoxy or a conductive die pad, similar to a flip chip, can be used instead of wire-bonding to provide an electrical connection between the die and the substrate panel.

Conductive contacts are preferably attached to a bottom portion 68 of substrate panel 60. Conductive contacts provide an electrically conductive area to communicate electrical signals from die 12. Any conductive contact known in the art can be used in the to provide an electrically conductive area on bottom portion 68 of substrate panel 60. Solder balls 16 are an example of conductive contacts. Solder balls 16 are electrically connected to wire bond pads 18 on top portion 66 of substrate panel 60 through electrically conductive vias passing through substrate panel 60 such as vias 22 seen in FIG. 1. Solder balls 16 can be arranged in any manner including, but not limited to being arranged into a ball grid array. Solder balls 16 can be supplied with or can be attached to substrate panel 60 during chip scale package fabrication. Although solder balls 60 can be attached to substrate panel 60 at any stage during the chip scale package fabrication process, the addition of solder balls 16 to bottom portion 68 of substrate panel 60 is preferably one of the last processes in the chip scale package fabrication process.

Electrical signals travel from die 12 to solder balls 16 on bottom portion 68 of substrate panel 60. Any means can be used for routing the electrical signals through substrate panel 60 to solder balls 16 including, but not limited to vias, flex (or copper/polyimide film), and TAB-like connections passing through substrate panel 60. In the context of this document, the term "via" is defined as an electrically conductive through hole, including but not limited to through holes that are filled with electrically conductive material, and through holes that have a wire extending therethrough so as to electrically connecting die 12 to the bottom of substrate panel 60. Generally, vias are electrically conductive through holes in substrate panel 60 that allow electrical signals to pass therethrough to the conductive contacts on bottom portion 68 of substrate panel 60, so that die 12 is in electrical communication with the conductive contacts. Vias can be formed using any known method in the art.

When a ceramic based material is used to form substrate 60, vias can be formed using a punching process while the substrate panel 60 is in its green state, followed by a filling of the punched holes with an electrically conductive material. If a FR-4 or a BT resin PCB material is used to form substrate 60, vias can be punched, drilled or laser drilled and then plated through with an electrically conductive material. Alternatively, when wire bonds are used to connect die 12 to solder balls 16, a hole is formed in the substrate and a wire bond is connected to die 12 and runs through the hole to the bottom of substrate 60 to connect die 12 to solder balls 16.

In a preferred embodiment of the present invention, wire bonds 20 and wire bond pads 18 are used to form an electrical connection between die 12 and solder balls 16 on a bottom portion 68 of substrate panel 60. A plurality of wire-bond pads 18 are preferably placed on substrate panel 60. As such, each die 12 is in electrical communication with a solder ball 16 through a wire bond 20 to a wire bond pad 18, or in flip chip applications with conductive adhesive or solder. Electrically conductive vias pass through substrate panel 60 provide electrical communication from wire bond pad 18 to solder ball 16.

Chip scale packages fabricated on substrate panel 60 are separated into a plurality cat S of singulated chip scale packages, as generally seen at reference numeral 10 in FIG. 1. Substrate panel 60 includes a plurality of cracker holes 54 therethrough that are used as break lines to singulate or separate chip scale packages from the other chip scale packages on substrate panel 60. The chip scale packages are singulated into individual, singulated chip scale packages along a break line or point of separation. Break lines can be formed by cracker holes, scoring, water jet abrasion, laser or thermal shock and sawing. When cracker holes 54 are formed between the chip scale package sites, the chip scale packages can be singulated by applying force along the break line defined along the line of cracker holes 54. Cracker holes 54 are formed using any method known in the art. When a ceramic based material is used to form the substrate, cracker holes 54 are preferably formed in substrate panel 60 using a puncher while substrate panel 60 is in a green state. Alternatively, when FR-4 or BT resin PCB material is used to form the substrate, cracker holes 54 are formed by punching, drilling or laser drilling.

In a preferred embodiment, the chip scale package is encapsulated prior to attaching conductive contacts to substrate panel 60 so that the components of the chip scale package, such as die 12 and wire bonds 18, are protected from damage that may occur during addition of the conductive ball contacts. As seen in phantom in FIGS. 1 and 2, an encapsulant 82 preferably covers the top portion of the chip scale package to protect the same. Encapsulant 82 can be added to the chip scale packages prior to singulation, or can be added after the plurality of chip scale packages have been singulated. In a preferred embodiment, the chip scale package is encapsulated prior to the attachment of conductive contacts, such as solder balls 16 to bottom portion 68 of substrate panel 60. Encapsulant 82 can be made of a material such as an elastomer, a glob-top epoxy, a thermo setting epoxy over-mold, a premolded plastic cover, a stamped metal cover or a polyimide.

When the chip scale packages are encapsulated prior to singulation, the indexing holes in the substrate panel allow the chip scale package to be encapsulated using existing automated machinery, such as lead frame handling equipment moving the substrate panel through encapsulation equipment. After encapsulation, the chip scale packages are then singulated using any of the above-mentioned singulation methods. If, however, the encapsulation material covers the cracker holes defining the break lines between the chip scale packages, the chip scale packages are preferably singulated by sawing along the brake lines. Cracker holes, however, are not necessary if the chip scale packages are singulated by sawing.

Figure 3:
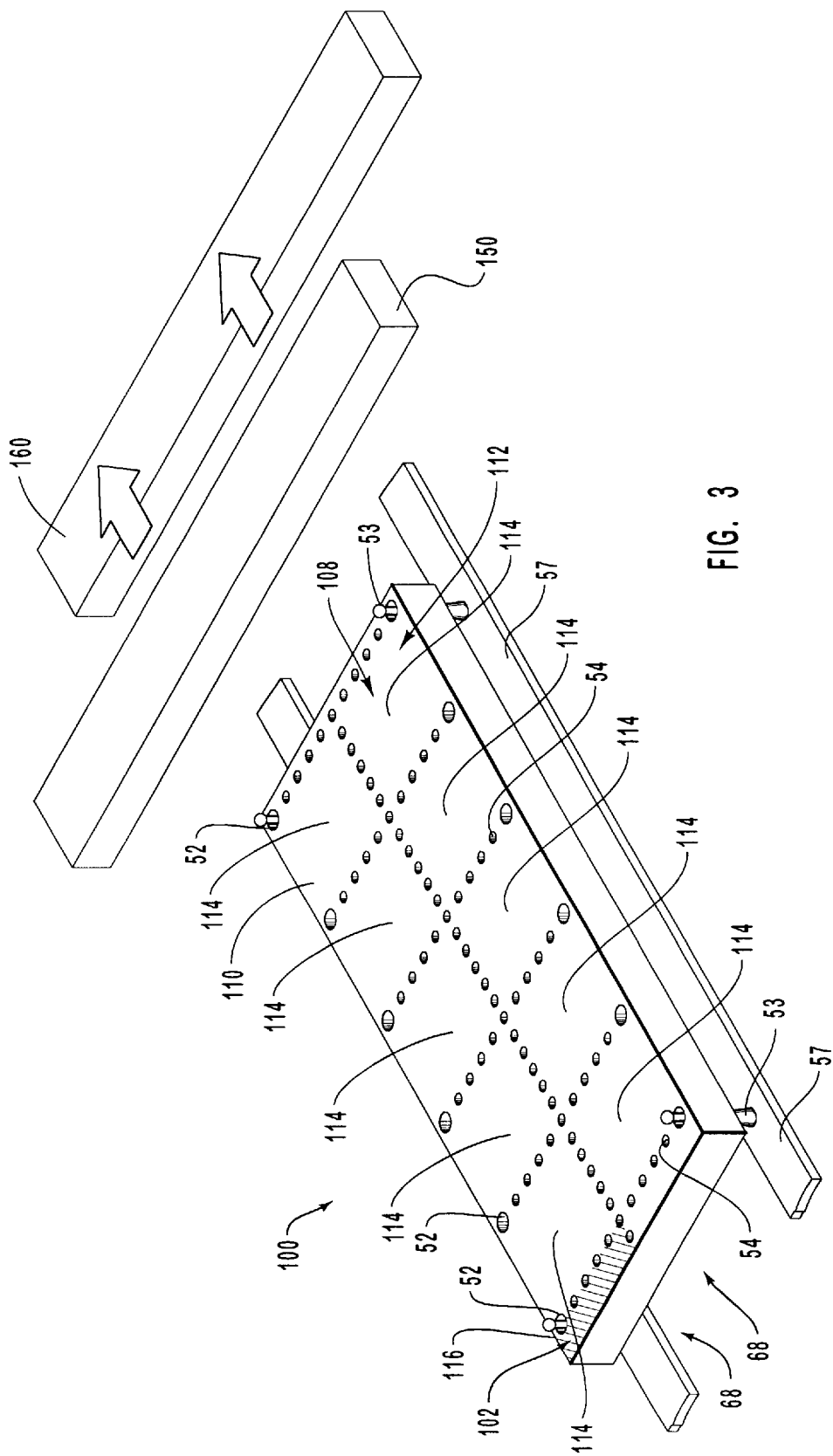
FIG. 3 is a perspective view of a substrate panel having there on a plurality of die attach areas, and having therethrough a plurality of indexing and cracker holes, and showing a partial view of a lead frame handling machine having a plurality of indexing pins extending through the substrate panel at respective indexing holes, where the lead frame handling machine moves the substrate panel through chip scale package fabrication equipment.

Now referring to FIG. 3, a substrate panel 100 functions as a holder, such as a boat or a tray, for a plurality of dies. The dies are to be placed on substrate panel 100 and are processed to fabricate chip scale packages. During fabrication, substrate panel 100 is indexed through lead frame handling equipment. As such, there is no need for individual dies to be handled by individual package trays or process boats during fabrication of chip scale packages. It should also be noted that reusable boats and trays that are compatible with lead frame handling equipment can be used, and reused, to transport substrates 100 during the fabrication of chip scale packages.

Substrate panel 100 can be composed of any semiconductive material, including but not limited to bulk semiconductive material such as a semiconductive wafer, either alone or in assemblies comprising other materials thereon, and semiconductive material layers, either alone or in assemblies comprising other materials. Substrate panel 100 can also be a ceramic substrate supplied by Kyocera, located at San Diego, Calif., USA.

Substrate panel 100 has a top portion 102 opposite a bottom portion 104 and is arranged in a 2×5 array to form 10 different die attach sites 114. Each die attach site 114 is for attaching a die 12 thereto, where each die 12 will be undergo a process to fabricate a chip scale package. In general, die attach sites on substrate panels can be two deep, three deep, etc. in orientation. While substrate panel 100 is illustrated in FIG. 3 as having 10 chip scale package sites, a longer substrate panel would yield a greater number of chip scale package sites. A limit as to the number of chip scale package sites that can be formed on the inventive substrate panel is only determined by the practicality of the size and number of chip scale package sites that can be included on a substrate panel that is indexed by lead frame handling equipment. Generally, lead frame handling equipment compatible with die attach and wire-bond assembly equipment may accommodate structures having widths of 6 inches or less. The thickness of the substrate panel may vary widely, depending on the equipment used to manufacture the chip scale package. Printed circuit board assembly equipment can be used to accommodate larger substrate panels (i.e., typically about 16×24 inch panels). Alternatively, if a flip chip bonder with a large table movement is used to form chip scale packages, larger substrate panels can be used to form multiple chip scale packages. Hence, the size of the substrate panel and the number of chip scale package sites thereon is dependent on the chip scale packaging equipment and the lead frame handling equipment moving the substrate panel therethrough.

Like substrate panel 60 in FIG. 2, substrate panel 100 in FIG. 3 has indexing holes 52 to allow substrate panel 100 to be indexed by automated lead frame handling assembly equipment. The lead frame handling assembly equipment indexes substrate panel 100 through chip scale packaging fabrication machinery seen in FIG. 3 at reference numerals 150 and 160, such as die attach, wire bonding and encapsulating equipment.

Indexing holes 52 are located in the periphery of substrate panel 100 so as to correspond with index pins 53 linearly driven by and situated upon a moving surface such as a tractor belt 57 of a lead frame handling machine. The number, size, exact location, as well as other characteristics of indexing holes 52 depends on the lead frame handling equipment and the chip scale packaging machinery. For instance, if printed circuit board assembly equipment is used, substrate panel 100 will preferably have indexing holes 52 that correspond to the printed circuit board assembly equipment.

Indexing holes 52 are formed by any method known in the art. When substrate panel 100 is formed from a ceramic based material, index holes 52 are preferably formed using a puncher while substrate panel 100 is in a green state. If a FR-4 or a BT resin PCB material is used to form substrate 100, indexing holes 52 can be formed by punching, drilling or laser drilling. Substrate panel 100 can be made of a substrate material and the desired shape of substrate panel 100 is cut from the substrate material and indexing holes 52 are formed into substrate panel 100.

Substrate panel 100 comprises numerous chip scale packaging sites (106, 108, 110, 112) each having a die attach area. A die is attached to the die attach area (114) on the substrate panel preferably using an existing die attach machine and the die is attached to the substrate panel using any means known in the art. Any die or chip typically used in the art can be used to form a chip scale package.

Referring to FIGS. 1 and 3, indexing holes 52 have inserted therethrough index pins 53. Index pins 53 are driven by lead frame handling equipment to move substrate panel 100 through chip scale packaging fabrication equipment 150, 160, such as a die attach machine to attach die 12 to each die attach area 114 on substrate panel 100. Once dies 12 are attached to substrate panel 100, index pins 53 are driven by lead frame handling equipment to move substrate panel 100 through a wire-bonding machine to attach a wire bond 20 from a respective die 12 to a corresponding wire bond pad 18 on substrate panel 100.

Figure 4:
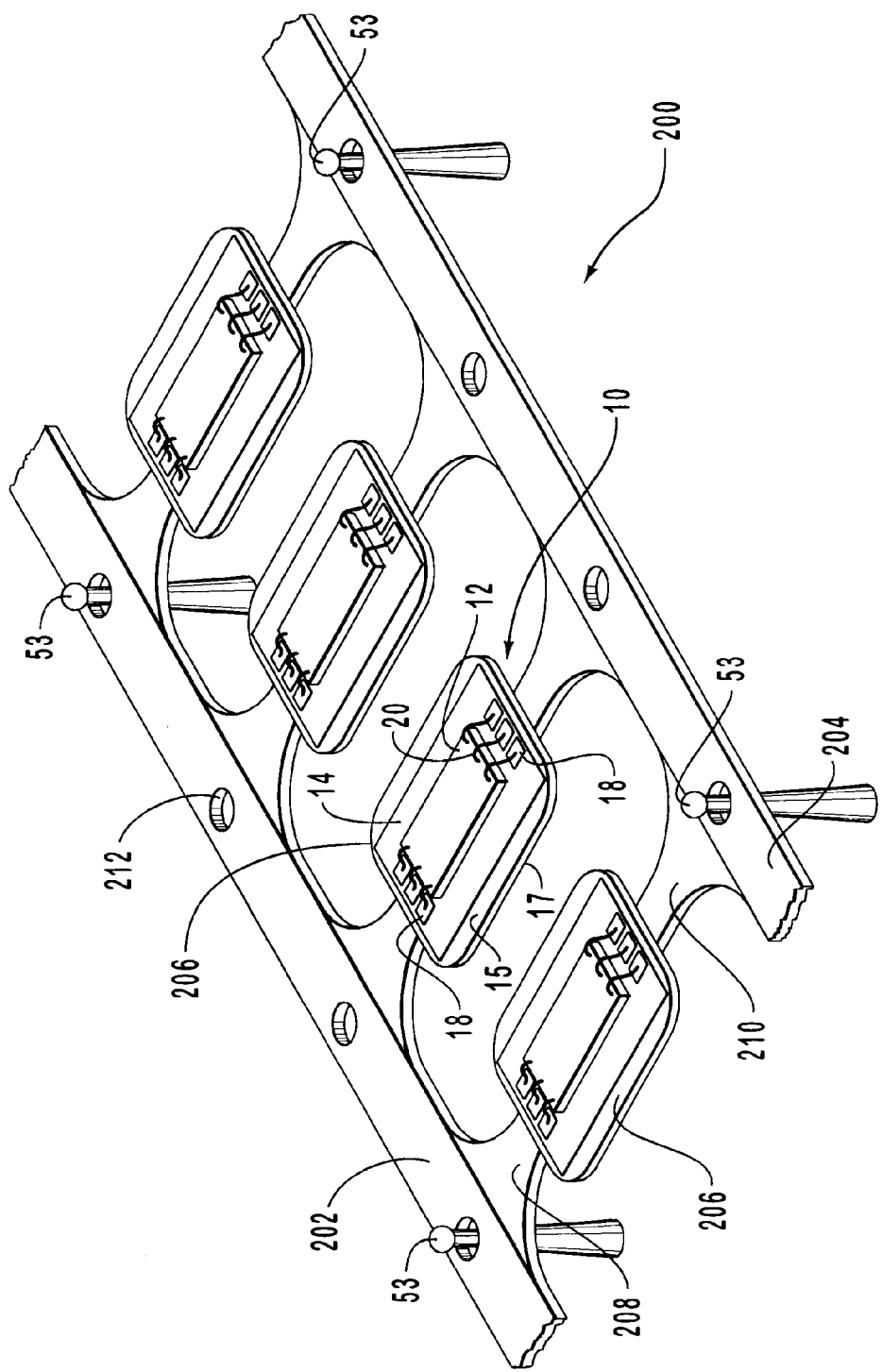
FIG. 4 is a perspective view of a chip scale package handler having support strips, each support strip having indexing holes extending therethrough, the chip scale package handler being adapted to receive a plurality of individual substrates, where each such substrate is to have a die attached thereto for the fabrication thereon of a respective plurality of chip scale packages.

In an alternative embodiment of the present invention, a frame support 200 seen in FIG. 4 has a first support strip 202 and a second support strip 204 having indexing holes 212 therein for indexing frame support 200 with lead frame handling equipment through the chip scale package fabrication process. Frame support 200 has a substrate holder 206 extending between first and second extensions 208, 210 which are respectively attached to first and second support strips 202, 204. Frame support 200 can be fabricated as a unitary piece as a cut out, punched, or etched from a single piece of material, such as a material from which lead frames are typically composed.

Referring to FIGS. 2, 3, and 4, index pins 53 of a lead frame handling machine move frame support 200 into machinery for placing an individual substrate 14 into each substrate holder 206. Substrate 14 has top surface 15 opposite bottom surface 17, and has having solder balls 16 thereon. Electrically conductive vias are formed through substrate 14 and provide a channel for electrical signals to solder balls 16. The lead frame handling equipment moves frame support 200 into die attach machinery to affix die 12 to each substrate 14 in substrate holder 206, then moves frame support 20 into wire bonding equipment to attach wire bonds 20 from die 12 to wire bond pads 18. Wire bond pads 18 are in electrical communication with an electrically conductive via extending through substrate 14 such that die 12 is electrically connected to solder balls 16.

Frame support 200 can be moved by lead frame handling equipment through a machine for encapsulating each die 12, substrate 14, and related connections with an encapsulating material. Any encapsulating material known in the art can be used to encapsulate the chip scale package components. In the event the solder balls 16 are not yet attached to bottom surface 17 of substrate 14, bottom surface 17 of substrate 14 can be accessed through substrate holder 206 by a machine for attaching conductive contacts. As such, the lead frame handling equipment is used to index, frame support 200 therethrough during the attachment of solder balls 16 to bottom surface 17 of substrate 14.

It should be noted that conductive contacts, such as solder balls 16, can be attached to bottom surface 17 of substrate 14 prior to substrate 14 being placed into substrate holder 206, or prior to die 12 being placed on substrate 14, or before or after when the electrical connections between die 12 and substrate 14 are formed. Also, there is no specific order with respect to when the chip scale package is encapsulated, either before or after the attachment of the conductive contacts to bottom surface 17 of substrate 14. For example, the conductive contacts can be added at any time during the chip scale packaging process, and the chip scale package can be encapsulated after the necessary chip scale packaging components have been added to top portion 17 of the chip scale package. To avoid damage to the chip scale package components, it may be preferable to encapsulate the chip scale package components prior to attaching the conductive contacts to bottom surface 17 of substrate 14.

It is to be understood that the chip scale packages in the present invention can be made by any method known in the art. The present invention may be modified to accommodate other chip scale package constructions, however, any chip scale package construction can be manufactured according to the present invention. For example, there are three general chip scale package constructions, each of which can be manufactured with the present invention. One chip scale package construction includes placing a die onto a die attach area on the top of a substrate, such as a ceramic, plastic or FR4-type substrate. The die is wire-bonded to wire-bond pads on the top of the substrate. Electrical signals are routed through the substrate by vias to conductive contacts, such as a ball grid array composed of solder balls, on the bottom of the substrate. The chip scale package is then soldered to a circuit board or to a multiple-chip module. A wire-bonded die on a substrate is illustrated in FIG. 1.

Another chip scale package arrangement is the stud bumping or solder bumping of the die bond pads and then forming a flip chip arrangement of the die onto a substrate, where the substrate is a ceramic, plastic, or FR4-type substrate. Conductive contacts, such as solder balls, are then placed on the side of the substrate opposite the die to form the chip scale package.

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method for manufacturing a plurality of chip packages comprising:

providing a chip packages holder including:
a first support strip having indexing holes;
a second support strip having indexing holes that is parallel to the first support strip;
a plurality of substrate holding units each:
being connected at opposite ends thereof, respectively, to the first and second support strips; and
having a top portion for receiving a chip substrate thereon and a bottom portion, said top portion being opposite the bottom portion; and
a plurality of open areas between the first and second support strips, each of the open areas being defined by an adjacent pair of said substrate holding units;
placing a chip substrate on one or more of said substrate holding units, each said chip substrate having a top surface with conductive landings and a die attach area, and a bottom surface opposite said top surface;
moving the chip packages holder to a die attach machine; and
attaching a die on the die attach area on the top surface of said chip substrate.

2. The method as defined in claim 1, wherein each of the chip substrates further comprises a plurality of electrically conductive vias connected to the conductive landings and extending from the top surface to the bottom surface, the method further comprising:

forming an electrical connection with a wire bond between at least one of the dies to at least one of the plurality of conductive landings on the top surface.

3. The method as defined in claim 2, further comprising applying a plurality of conductive contacts to the bottom surface of each of the chip substrates, at least one of said conductive contacts being in electrical communication with at least one of said vias.

4. The method as recited in claim 1, further comprising singulating each die attach area and the die thereon from the respective substrate holding unit.

5. The method as recited in claim 1, wherein the first and second support strips are a unitary piece of material.

6. The method as recited in claim 1, wherein the first and second support strips are from a lead frame that is a single piece of material.

7. The method as recited in claim 1, further comprising:

encapsulating said dies with a compound applied thereover, such that each one of said die is encapsulated on each one of said chip substrates on the top surface thereof.

8. The method as defined in claim 1, further comprising:
moving the chip packages holder by extending indexing pins into at least a portion of the indexing holes of the first and second support strips; and
moving said indexing pins.

9. The method as defined in claim 8, where the indexing pins are moved by a lead frame handling machine.

10. A method for manufacturing chip packages comprising:
providing a chip packages holder including:
a first support strip including a plurality of indexing holes;
a second support strip including a plurality of indexing holes that is parallel to the first support strip;
a plurality of substrate holding units each:
being connected at opposite ends thereof, respectively, to the first and second support strips; and
having a top portion for receiving a chip substrate thereon and a bottom portion, said top portion being opposite the bottom portion, wherein the plurality of substrate holding units remain attached to the first support strip and to the second support strip upon separation of each chip substrate from each top portion of each substrate holding unit; and
a plurality of open areas between the first and second support strips, each of the open areas being defined by an adjacent pair of said substrate holding units;
placing a chip substrate on one or more of said substrate holding units, each said chip substrate having a top surface with conductive landings and a die attach area, and a bottom surface opposite said top surface, the bottom surface of each said chip substrate being on said top portion of said substrate holding units, and each said chip substrate further comprising a plurality of electrically conductive vias electrically connected to the conductive landings and extending from said top surface to said bottom surface;
applying a force to the first and second support strips by the indexing holes so as to move the chip packages holder to a die attach machine;
placing a die on each of said top surfaces such that said die and said conductive landings are on the same top surface side of said chip substrate and remain on said top surface side for encapsulation;
attaching the die to the top surface of each chip substrate with the die attach machine;
applying a force to the first and second support strips by the indexing holes so as to move the chip packages holder to a wire bonding machine;
forming at least one wire bond with the wire bonding machine between each said die and at least one of the conductive landings on the top surface of the chip substrate;
applying a force to the first and second support strips by the indexing holes so as to move the chip packages holder to a soldering machine; and
attaching a plurality of conductive contacts on the bottom surface of the chip substrate with the soldering machine such that the conductive contacts are in electrical contact with the vias.

11. The method as recited in claim 10, further comprising singulating each die attach area and the die thereon from the respective substrate holding unit.

12. The method as recited in claim 10, further comprising encapsulating the plurality of dies on each said die attach area, such that each one of said dies is encapsulated on each one of said substrates on the top surface thereof.

13. The method as recited in claim 10, further comprising encapsulating the plurality of dies on each said die attach area before moving the chip packages holder through the soldering machine, wherein each one of said dies is encapsulated on each one of said substrates on the top surface thereof.

14. The method as recited in claim 10, further comprising singulating each die attach area, chip substrate and the die thereon from the respective substrate holding unit, and then encapsulating the plurality of separated die attach areas and the dies thereon.

15. The method as recited in claim 10, further comprising encapsulating the plurality of dies on each said die attach area, such that each one of said dies is encapsulated on each one of said substrates on the top surface thereof, and then singulating each die attach area and the die thereon from the respective substrate holding unit.

16. The method as recited in claim 10, further comprising encapsulating each of the plurality of dies after attaching said plurality of conductive contacts on the bottom surface of the substrate, wherein each one of said dies is encapsulated on each one of said substrates on the top surface thereof.

17. The method as recited in claim 10, wherein the first and second support strips are from a lead frame that is a single piece of material.

18. A method for manufacturing a plurality of chip packages comprising:
providing a chip packages holder including:
a first support strip including a plurality of indexing holes;
a second support strip including a plurality of indexing holes that is parallel to the first support strip;
a plurality of substrate holding units each:
being connected at opposite ends thereof, respectively, to the first and second support strips; and
having a top portion for receiving a chip substrate thereon opposite a bottom portion, wherein the plurality of substrate holding units remain attached to the first support strip and to the second support strip upon separation of each chip substrate from each top portion of each substrate holding unit; and
a plurality of open areas between the first and second support strips, each of the open areas being defined by an adjacent pair of said substrate holding units;
placing a chip substrate on one or more of said substrate holding units, each said chip substrate having a top surface with conductive landings and a die attach area, and a bottom surface opposite said top surface, the bottom surface of each said chip substrate being on said top portion of said substrate holding units, and each said chip substrate further comprising a plurality of electrically conductive vias electrically connected to the conductive landings and extending from said top surface to said bottom surface;
extending a plurality of indexing pins into at least portion of the plurality of indexing holes; and
moving said plurality of indexing pins to move the chip packages holder to perform at least one of:
attaching a die to the die attach area on the top surface of the chip substrate;

forming an electrical connection with at least one wire bond attached between the die and at least one of the conductive landings on the top surface of the chip substrate;

soldering a plurality of conductive contacts to the bottom surface of the chip substrate, at least one of said conductive contacts being in electrical communication with at least one of said vias; and separating each chip substrate and the die thereon from the respective substrate holding unit.

19. The method as defined in claim 18, wherein the indexing pins are moved by a lead frame handling machine.

20. A method for manufacturing a plurality of chip packages comprising:

providing a chip packages holder including:
- a first support strip having indexing holes;
- a second support strip having indexing holes that is parallel to the first support strip;
- a plurality of chip substrate holding units each:
  - being connected at opposite ends thereof, respectively, to the first and second support strips; and
  - having a chip substrate holder for holding a chip substrate thereon, wherein the plurality of substrate holding units remain attached to the first support strip and to the second support strip upon separation of each chip substrate from each substrate holding unit; and
- a plurality of open areas between the first and second support strips, each of the open areas being defined by an adjacent pair of said substrate holding units;

placing a chip substrate on one or more of said substrate holding units, each said chip substrate having a top surface with conductive landings and a die attach area, and a bottom surface opposite said top surface, the bottom surface of each said chip substrate being on said substrate holding units; and fabricating the plurality of chip packages with said chip packages holder, wherein said fabricating comprises moving the chip packages holder to at least one of:
- a die attach machine for attaching a die to the top surface of each said chip substrate;
- a wire bonding machine for forming an electrical connection with at least one wire bond attached to the die;
- a soldering machine for soldering a plurality of conductive contacts to each said chip substrate; and
- a singulation machine for singulating each said chip substrate and the die thereon.

21. The method as defined in claim 20, wherein each said open area extends from the first support strip to the second support strip.

22. The method as defined in claim 20, wherein there is one of said substrate holding units between each adjacent pair of said open areas.

23. The method as defined in claim 20, wherein each said open area is further defined by the first and second support strips.

24. The method as defined in claim 20, wherein the substrate holder holds a chip substrate in contact non-adhesive engagement.

25. The method as defined in claim 20, wherein the first and second support strips are a unitary piece of a material.

26. The method as defined in claim 20, wherein each said chip substrate comprises:
- a plurality of electrically conductive vias electrically connected to the conductive landings and terminating at the top surface and at the bottom surface.

27. The method as defined in claim 20, wherein:
- the die attach machine attaches a die to each said die attach area;
- the wire bonding machine forms a plurality of electrical connections with a wire bond attached by said wire bonding machine between each said die and the conductive landings on the top surface of each said chip substrate; and
- the soldering machine solders each said conductive contact to a respective one of said electrically conductive vias.

28. A method for manufacturing a plurality of chip packages comprising:

providing a chip packages holder including:
- a first support strip;
- a second support strip that is parallel to the first support strip;
- a plurality of substrate holding units each including:
  - a substrate holder for holding a chip substrate;
  - a first extension attached to the substrate holder at one end thereof and attached to the first support strip at the other end thereof; and
  - a second extension attached to the substrate holder at one end thereof and attached to the second support strip at the other end thereof, wherein the plurality of substrate holding units remain attached to the first support strip and to the second support strip upon separation of each chip substrate from each substrate holding unit;
- a plurality of voids situated between the first and second support strips, wherein there is one void between each adjacent pair of said substrate holding units;

placing a chip substrate on one or more of said substrate holding units, each said chip substrate having a top surface with conductive landings and a die attach area, and a bottom surface opposite said top surface, the bottom surface of each said chip substrate being on said substrate holding units; and fabricating the plurality of chip packages with said chip packages holder, wherein said fabricating comprises moving the chip packages holder to at least one of:
- a die attach machine for attaching a die to each said chip substrate;
- a wire bonding machine for forming an electrical connection, with at least one wire bond attached by said wire bonding machine to the die;
- a soldering machine for soldering a plurality of conductive contacts to each said chip substrate; and
- a singulation machine for singulating each said chip substrate and the die thereon.

29. The method as defined in claim 28, wherein each said void is defined by:
- the first and second support strips;
- an adjacent pair of said substrate holding units; and
- one pair of said first and second extensions that is adjacent to another pair of said first and second extensions.

30. The method as defined in claim 28, wherein each of the first and second support strips have a plurality of index holes therein.

31. The method as recited in claim 28, wherein the first and second support strips are a unitary piece of a material.

32. The method as recited in claim 28, wherein the first and second support strips are a unitary piece of a lead frame material.

33. The method as defined in claim 28, wherein each said chip substrate comprises:

a plurality of electrically conductive vias electrically connected to the conductive landings and terminating at the top surface and at the bottom surface.

34. The method as defined in claim 33, wherein:

the die attach machine attaches a die to each said die attach area;

the wire bonding machine forms a plurality of electrical connections with a wire bond attached by said wire bonding machine between each said die and the conductive landings on the top surface of each said chip substrate; and the soldering machine solders each said conductive contact to a respective one of said electrically conductive vias on the bottom surface of each said chip substrate.

* * * * *

UNITED STATES PATENT AND TRADEMARK OFFICE
CERTIFICATE OF CORRECTION

PATENT NO. : 6,574,858 B1  
DATED : June 10, 2003  
INVENTOR(S) : David R. Hembree It is certified that error appears in the above-identified patent and that said Letters Patent is hereby corrected as shown below:

Title page,
Item [56], References Cited, U.S. PATENT DOCUMENTS, insert

|          |        |                |         |
|----------|--------|----------------|---------|
| -- 4,426,773 | 1/1984 | Hargis............... | 29/832 |
| 5,496,535 | 3/1996 | Abbott............... | 156/556 |
| 5,732,465 | 3/1998 | Tokita et al. ......... | 29/841 |
| 5,661,086 | 8/1997 | Nakashima et al...... | 257/668 |
| 5,620,928 | 4/1997 | Lee et al............. | 438/118 |
| 5,727,311 | 3/1998 | Ida et al............. | 29/832 -- |

Column 1,
Line 30, after "balls 16" delete "through vias 22"

Column 3,
Line 57, before "to provide" delete "in the"
Line 62, after "panel 60" insert a comma Column 4,
Line 46, after "plurality" delete "cat S"

Column 5,
Line 52, after "will" delete "be"

Column 6,
Line 48, after "Referring to" change "FIGS. 1 and 3" to -- FIGS. 2 and 3 --

Column 7,
Line 8, before "solder balls" delete "having"
Line 11, after "balls" change "16." to -- 16, as seen in Figure 1. --
Line 28, before "support" change "index,frame" to -- index frame --
Line 43, after "top" change "portion 17" to -- surface 15 --

UNITED STATES PATENT AND TRADEMARK OFFICE
CERTIFICATE OF CORRECTION

PATENT NO. : 6,574,858 B1
DATED : June 10, 2003
INVENTOR(S) : David R. Hembree

It is certified that error appears in the above-identified patent and that said Letters Patent is hereby corrected as shown below:

Column 8,
Line 9, after "only as" change "illustrated" to -- illustrative --

Column 12,
Line 1, before "wherein:" change "claim 20," to -- claim 26, --

Signed and Sealed this

Ninth Day of December, 2003

JAMES E. ROGAN
*Director of the United States Patent and Trademark Office*